United States Patent [19]

Haskell

[11] Patent Number: 4,609,934
[45] Date of Patent: Sep. 2, 1986

[54] SEMICONDUCTOR DEVICE HAVING GROOVES OF DIFFERENT DEPTHS FOR IMPROVED DEVICE ISOLATION

[75] Inventor: Jacob D. Haskell, Palo Alto, Calif.

[73] Assignee: Advanced Micro Devices, Inc., Sunnyvale, Calif.

[21] Appl. No.: 597,616

[22] Filed: Apr. 6, 1984

[51] Int. Cl.[4] .............................................. H01L 27/02
[52] U.S. Cl. ...................................... 357/42; 357/49; 357/55; 357/59
[58] Field of Search ........................ 357/42, 55, 49, 59

[56] References Cited

U.S. PATENT DOCUMENTS

| | | | |
|---|---|---|---|
| 4,079,407 | 3/1978 | Hutson | 357/55 X |
| 4,160,991 | 7/1979 | Anantha | 357/49 |
| 4,214,315 | 7/1980 | Anantha | 357/49 X |
| 4,240,095 | 12/1980 | Rossetti | 357/55 X |
| 4,255,207 | 3/1981 | Nicolay | 357/55 X |

Primary Examiner—Martin H. Edlow
Attorney, Agent, or Firm—J. Vincent Tortolano; Patrick T. King; Eugene H. Valet

[57] ABSTRACT

A semiconductor device having grooves of different depths for improved device isolation is presented. In the preferred embodiment of the present invention, a first groove and a second groove provide isolation of devices within regions of different conductivity type. The first and second grooves are each shallower than the conductivity type region in which they reside. A third groove is formed between adjacent regions of different conductivity type. The third groove is deeper than both the first groove and the second groove and extends to a depth sufficient to penetrate the substrate of the semiconductor device. The third groove operates to prevent latch-up between devices in the adjacent well regions. Filler materials are used to fill the first, second and third grooves to improve their respective isolating characteristics.

8 Claims, 10 Drawing Figures

SEMICONDUCTOR DEVICE HAVING GROOVES OF DIFFERENT DEPTHS FOR IMPROVED DEVICE ISOLATION

CROSS-REFERENCE TO A RELATED APPLICATION

A process for constructing the semiconductor device of the present invention is described in a U.S. Pat. No. 4,495,025, issued Jan. 22, 1985 entitled, Process for Forming Grooves Having Different Depths Using a Single Masking Step, filed the same day as the application contained herein by the same inventor, and assigned to the same assignee.

BACKGROUND OF THE INVENTION

1. Field of the Invention

This invention relates to a semiconductor integrated circuit device having regions of different conductivity type, and more particularly to a semiconductor device having grooves of different depths for improved device isolation.

2. Description of the Prior Art

The increase in densities of integrated circuits has instigated a trend in isolation technology of using trench or groove formation processes for forming physical gaps between active regions in lieu of the more conventional pn junction and local oxidation (LOCOS TM) structures. See, e.g., D. N. K. Wang, et al, "Reactive-Ion Etching Eases Restrictions on Materials and Feature Sizes", *Electronics*, Nov. 3, 1983, pp. 157,159. Groove isolation is particularly useful in CMOS applications as a method of improving latch-up susceptibility. See, e.g., T. Yamaguchi, et al., "High Speed Latch-up Free 0.5-um Channel CMOS Using Self-Aligned $TiSi_2$ and Deep-Trench Isolation Technologies", *Proceedings IEDM* 1983, p. 522. Latch-up can be defined as a state of high excess current accompanied by a low-voltage condition, such that a CMOS device can exhibit parasitic bipolar action, in essence creating a conductive low-impedance path between adjacent devices or substrate areas. Within a well of a CMOS device, a vertical parasitic bipolar device may be formed. In addition, parasitic action can occur laterally between devices within adjacent wells or substrate areas of different conductivity type.

The potential for the occurrence of latch-up increases as circuit density increases (i.e. individual devices are positioned closer together). Conventional techniques for isolating active devices suffer from a density penalty which is greatly reduced by the use of grooves for device isolation.

The type of groove necessary to prevent latch-up differs from the type of groove necessary to obtain isolation, specifically with regard to the physical dimensions of the grooves. In particular, a deeper groove is necessary to prevent latch-up between devices in adjacent regions of different conductivity type (sometimes termed wells), while a shallower groove is sufficient to provide isolation between adjacent devices within the same well. Thus, it is desirable to employ grooves of various types on the same integrated circuit, to provide isolation of devices within and between regions of different conductivity type.

SUMMARY OF THE INVENTION

The present invention is directed to a semiconductor device having grooves of different depths for improved device isolation. A specific embodiment of the present invention relates to a CMOS structure having a substrate and an epitaxial layer over the substrate. Grooves of different depths are provided in accordance with the present invention for isolating devices within an N-well of the epitaxial layer, and within a P-well of the epitaxial layer, and for preventing latch-up between devices in the adjacent N-well and P-well. In particular, a first groove and a second groove are used to provide isolation of devices within the well regions, with the first groove being used in the N-well and the second groove being used in the P-well. The first groove and the second groove are each shallower in depth than the conductivity type region (i.e., N-well or P-well) in which they respectively reside.

A third groove is situated between the N-well and the P-well to prevent latch-up between devices in the adjacent wells. The third groove is deeper than the first and second grooves, extending to a depth sufficient to penetrate the substrate.

In accordance with the specific embodiment of the present invention, the first and second grooves are filled with a non-conducting filler material, and the third groove is filled with a non-conducting or poor conducting filler material, so as to improve the isolating characteristics of the grooves.

When the third groove is filled with a poor conducting filler material such as polysilicon which reduces thermal stress, a layer of thermal oxide is used on the inside surface of the third groove, to isolate the polysilicon filler material from the epitaxial layer.

Furthermore, before filling the first and second grooves with filler material, each groove is implanted with an impurity of a conductivity type opposite to the conductivity type of the groove in which it resides (eg. a P-type impurity in the first groove in the N-well and an N-type impurity in the second groove in the P-well). Implanting in this manner also serves to provide better isolation.

Accordingly, it is an object of this invention to provide a semiconductor device having grooves of different depths for improved device isolation.

It is a further object of this invention to provide a semiconductor device having shallow grooves for isolation of devices within well regions of different conductivity type and a deep groove to prevent latch-up between devices in adjacent regions of different conductivity type.

An advantage of the present invention is improved device isolation in a semiconductor integrated circuit.

A further advantage is that isolation of devices using grooves of different depths allows device geometry to be scaled down to a greater extent than is possible using other types of isolation technology.

Further objects and advantages of this invention will become apparent from the study of the following portion of the specification, the claims and the attached drawings.

BRIEF DESCRIPTION OF THE DRAWINGS

FIGS. 1a–1k are cross-sections showing a process sequence where grooves of different depths are formed in a wafer of semiconductor material utilizing a single masking step, and in which particularly:

FIG. 1a is a cross-section of a layer of protective material on a wafer of semiconductor material having N-well and P-well regions in an epitaxial layer over a substrate;

FIG. 1b is a cross-section showing FIG. 1a after a masking layer of photoresist material has been applied;

FIG. 1c is a cross-section showing FIG. 1b after the layer of photoresist material has been optically exposed and then developed to expose the portions of the layer of protective material where grooves are to be formed;

FIG. 1d is a cross-section showing FIG. 1c after the layer of protective material has been etched to expose the portions of the epitaxial layer where grooves are to be formed;

FIG. 1e is a cross-section showing FIG. 1d after first and second type grooves have been etched into the epitaxial layer;

FIG. 1f is a cross-section showing FIG. 1e after the masking layer of photoresist material has been stripped and a second layer of protective material has been applied over the first layer of protective material and over the previously formed grooves;

FIG. 1g is a cross-section showing FIG. 1f after the second layer of protective material has been anisotropically etched to clear the bottom area of the second type groove, exposing the underlying surface of the epitaxial layer;

FIG. 1h is a cross-section showing FIG. 1g after the second type groove and the underlying epitaxial layer have been etched to penetrate the substrate of the semiconductor wafer;

FIG. 1j is a cross-section showing FIG. 1h after the second type groove has been filled with a filler material;

FIG. 1k is a cross-section showing FIG. 1j with an oxide layer formed on the inside surface of the second type groove.

DETAILED DESCRIPTION OF A SPECIFIC EMBODIMENT

Reference is now made in detail to a specific embodiment of the present invention, which illustrates the best mode presently contemplated by the inventor for practicing the invention, the specific embodiment of which is set forth in the accompanying drawings. A process for constructing the semiconductor device of the present invention will be described first, and then the structure of the device will be summarized.

The process of the present invention for forming grooves of different depths in a semiconductor material has general application to device isolation in integrated circuits. Device isolation is particularly critical in scaling down device geometries of Complementary Metal Oxide Semiconductor (CMOS) integrated circuits. In accordance with the preferred embodiment of the present invention, FIGS. 1a-1j are cross-sections showing a process sequence where grooves of different depths are formed in a CMOS wafer utilizing a single masking step.

Figure 1A:
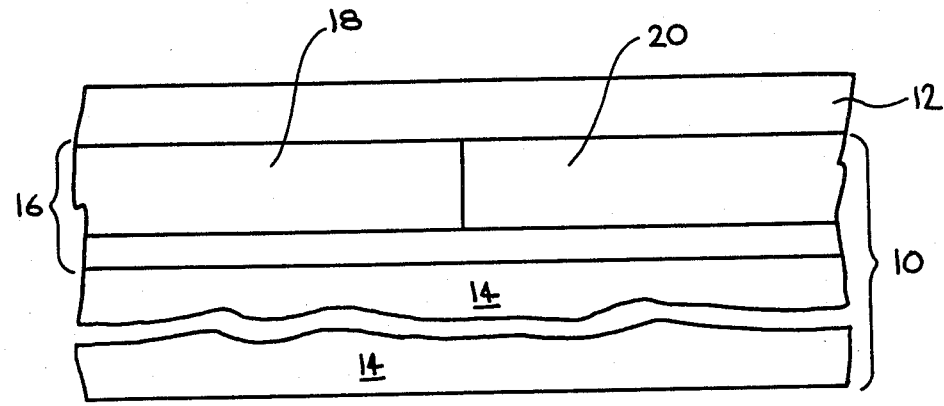

FIG. 1a shows a semiconductor wafer 10 covered by a layer of silicon dioxide 12. The semiconductor wafer 10 includes a substrate 14 and an expitaxial layer 16. The epitaxial layer 16 includes an N-well region 18 and a P-well region 20. The epitaxial layer 16, comprised of silicon, can be formed by conventional deposition techniques of contacting the substrate 14 with a flow of gas (e.g., silicon tetrachloride) at an elevated temperature. The N-well region 18 and the P-well region 20 can be formed by conventional diffusion techniques for introducing a controlled amount of selected impurities into selected regions of a semiconductor crystal. The oxide layer 12 can be formed by conventional chemical vapor deposition techniques. As described below, the oxide layer may be masked and opened up by lithographic, masking and etching techniques. The regions that are opened up will establish the areas where grooves are to be formed.

Figure 1B:
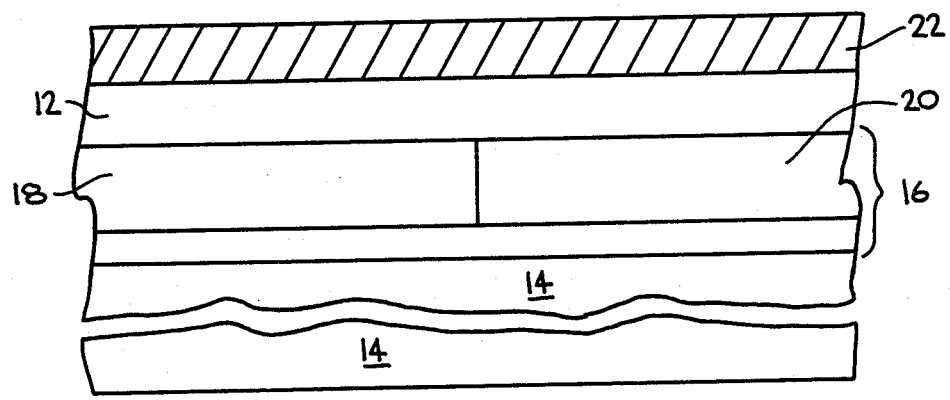
Figure 1C:
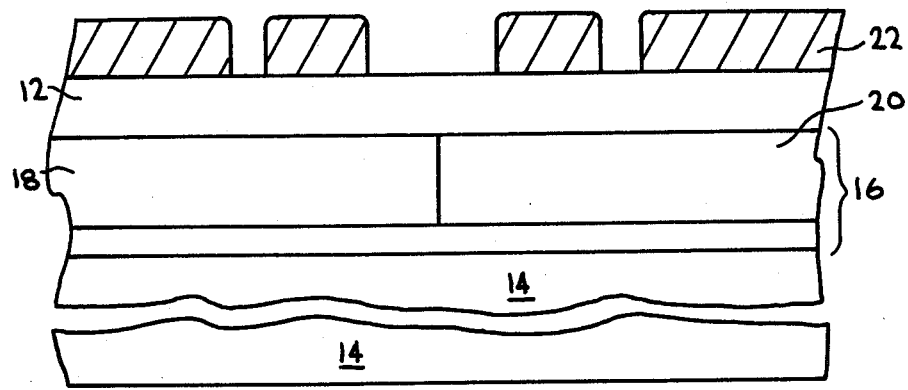

FIG. 1b shows the cross-section of FIG. 1a after a masking photoresist layer 22 has been applied over the oxide layer 12. The masking photoresist layer 22 can be applied in a conventional manner such as spinning or spraying onto a semiconductor wafer a chemical formulation containing a light sensitive material. The masking photoresist layer 22 is then optically exposed by conventional techniques to define within the mask images for two first type grooves and a second type groove, where each first type groove image is narrower in width than the second type groove image. Then, as shown in FIG. 1c, the masking photoresist layer 22 is developed by placing it in contact with a developing agent, thereby opening up the masking photoresist layer 22 to allow the etching of the oxide layer 12.

Figure 1D:
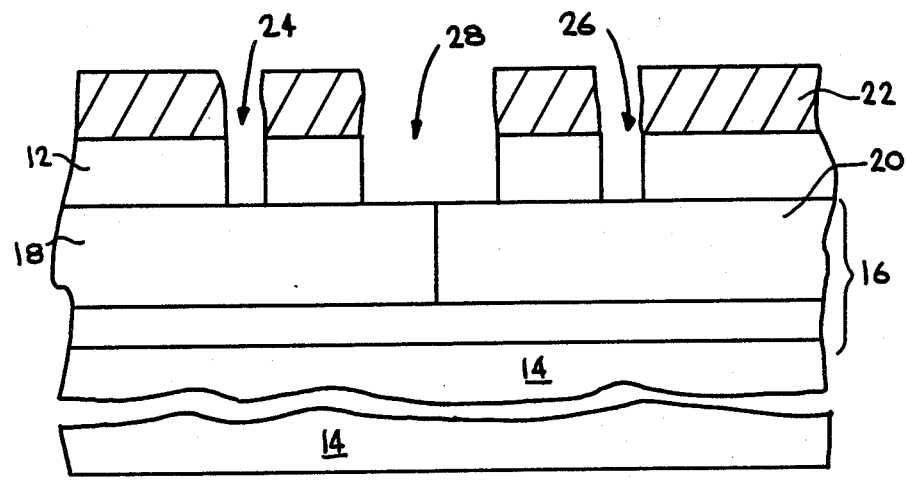
Figure 1E:
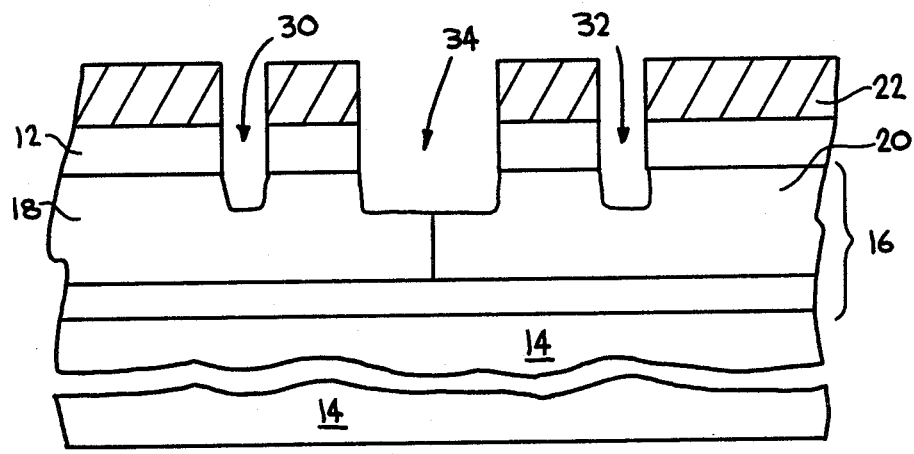

Next, using a conventional oxide etchant, the oxide layer 12 is etched down to the epitaxial layer 16, as shown in FIG. 1d, to define first type groove regions 24 and 26 and a second type groove region 28. Then, as shown in FIG. 1e, the exposed regions 24, 26 and 28 of the epitaxial layer 16 are etched using a conventional oxide etching technique to form the first type grooves 30 and 32 and the second type groove 34. The first type grooves 30 and 32 are narrower in width than the second type groove 34 in accordance with the images previously transmitted into the masking photoresist layer 22. The depth of the grooves is controlled by the length of the etch. In accordance with the preferred embodiment of the present invention, the first type grooves 30 and 32 will function to isolate devices within the N-well and P-well regions 18 and 20, respectively. Therefore, the depth of the grooves 30 and 32 must be less than the depth of the N-well and P-well regions 18 and 20 so that adjacent devices within a well can be isolated.

According to the preferred embodiment of the present invention, the second type groove will function to isolate the N-well and P-well regions 18 and 20 from each other. Therefore, the second type groove 34 must be formed at the intersection of N-well and P-well regions 18 and 20, and the depth of the second type groove 34 must be greater than the depth of the N-well and P-well regions 18 and 20, i.e., the second type groove 34 must penetrate the substrate 14. The process of the present invention can also be applied to provide isolation between a well region of one conductivity type and a substrate area of a different conductivity type.

After the grooves 30, 32 and 34 have been etched in the epitaxial layer 16, the masking photoresist layer 22 is stripped from the oxide layer 12. Removal of the masking photoresist layer 22 may be accomplished by conventional techniques which employ solvents, acid baths or reactive oxidation for photoresist removal. After removal of the masking photoresist layer 22, a second protective layer of a predetermined thickness will be deposited over the exposed surfaces of the oxide layer 12 and the epitaxial layer 16.

Figure 1F:
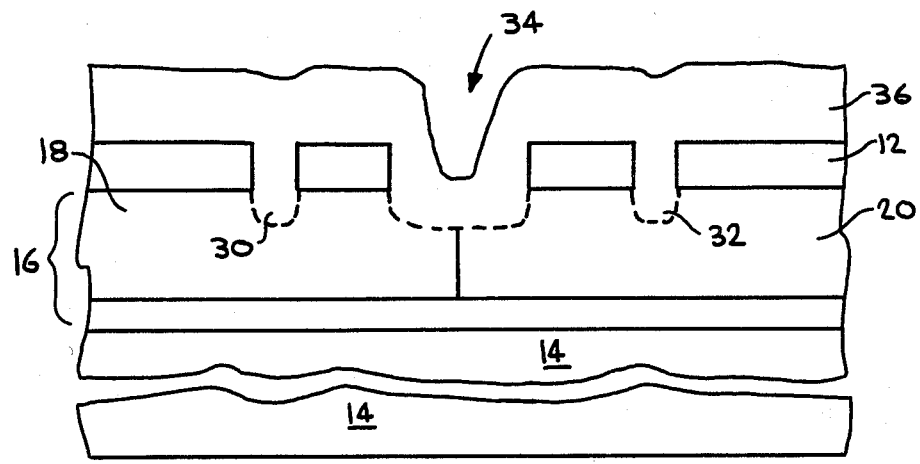

Next, as illustrated in FIG. 1f, a second protective layer of silicon dioxide 36 is universally deposited over the exposed surface of the integrated circuit in process. The second oxide layer 36 can be formed to a predetermined thickness by conventional chemical vapor deposition techniques. The second oxide layer 36 will substantially fill the narrower first type grooves 30 and 32 but will only partially fill the wider second type groove 34, as a result of the different groove widths.

Figure 1G:
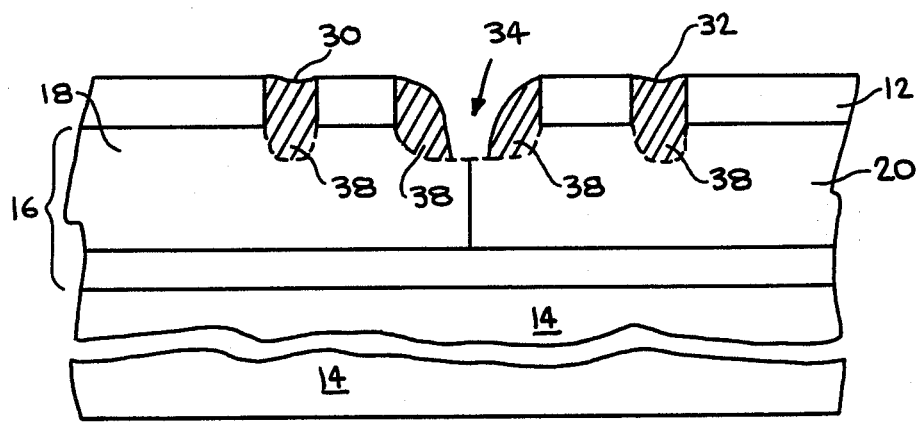

After application, the second oxide layer 36 is etched down to the surface of the first oxide layer 12 by an anisotropic etching step which removes the second oxide layer 36 from the bottom of the second type groove 34, thereby exposing a region of the underlying epitaxial layer 16, as shown in FIG. 1g.

The end point of the anisotropic etching process is determined by the thickness of the second oxide layer 36. The precise thickness of the second oxide layer 36 is calculated such that anisotropically etching down to the surface of the first oxide layer 12 will remove the second oxide layer 36 from the bottom of the second type groove 34, thereby exposing a region of the underlying epitaxial layer 16. For example, if the first type grooves 30 and 32 are each 1.5 microns in width and 1 micron deep, and the second type groove 34 is 4 microns in width and 1 micron deep, a second oxide layer 36 of approximately 1.5–2.0 microns in thickness will fill the first type grooves 30 and 32, and will partially fill the second type groove 34 with an appropriate amount of material to achieve the desired results on the subsequent etching of the second oxide layer 36. After the second oxide layer 36 has been etched, the first type grooves 30 and 32 remain substantially filled with oxide material 38, which improves the isolating characteristics of the first type grooves 30 and 32. Also, prior to the application of the second oxide layer 36, the first type grooves 30 and 32 can be implanted with impurities 41, 43 of a conductivity type different from the conductivity type of the region in which the groove is formed (e.g., implanting a P-type 41 material in the first type groove 30 in the N-well region 18). Implanting in this manner will provide better isolation because it will create p-n junctions deeper than the grooves 30,32. These p-n junctions prevent current from flowing from one side of the groove to the other around the groove periphery.

Figure 1H:
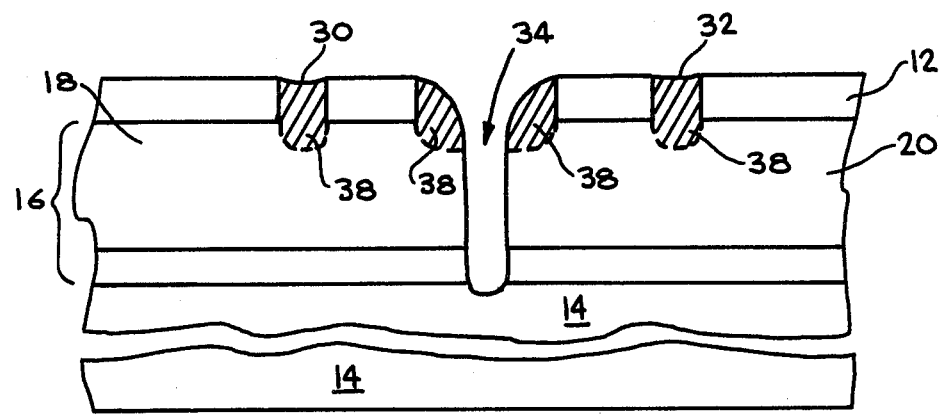

Following the etch to remove the second oxide layer 36 from the bottom of the second type groove 34, a conventional selective etchant is used to etch the second type groove 34 and the exposed region of the underlying epitaxial layer 16 to a depth sufficient to penetrate substrate 14, as shown in FIG. 1h. An etchant is used which selectively etches the epitaxial layer 16 and the substrate 14 preferentially over the oxide layer 12 and the oxide material 38 in first type grooves 30 and 32. By using an appropriate etchant of the type known in the art to have selective etching properties, the second type groove 34 can be etched to a depth sufficient to penetrate the substrate 14, while leaving the oxide layer 12 and the oxide material 38 in first type grooves 30 and 32 substantially unchanged. By intersecting the substrate 14, the second type groove 34 effectively isolates the N-well and P-well regions 18 and 20 from each other. The doping of the substrate 14 is typically in excess of $10^{18}$ impurities/cm$^3$. The heavy doping insures that there is sufficient recombination of minority carriers to make the second type groove 34 effective.

Figure 1J:
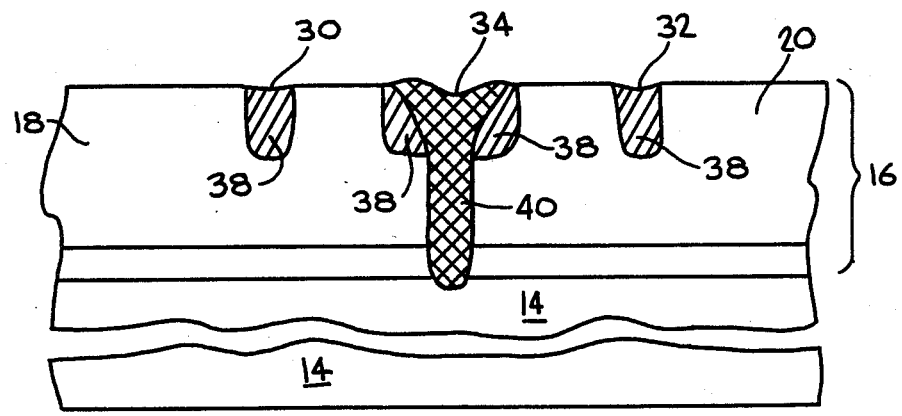
Figure 1K:
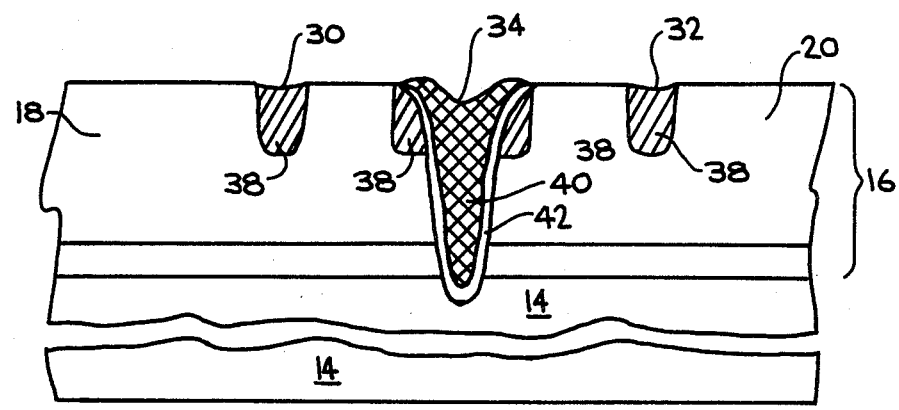

After the second type groove 34 has been etched to penetrate the substrate 14, it can be filled with a filler material 40 as shown in FIG. 1j. The filler material 40 can be a non-conducting type of material chosen from appropriate materials known in the art such as oxide. If oxide is to be used as filler material, it is first universally deposited over the surface of the integrated circuit in process by conventional techniques such as low pressure chemical vapor deposition (not shown). An anisotropic etching step is then performed to etch the previously deposited oxide layer and the oxide layer 12 back to the silicon surface of the epitaxial layer 16. Alternatively, an etching step may be done first to etch the oxide layer 12 back to the surface of epitaxial layer 16. Then, a layer of oxide can be deposited over the exposed surface of the epitaxial layer 16 thereby filling the second type groove 34, followed by an etching of the deposited oxide back to the surface of the epitaxial layer 16. Other methods of etching and filling the second type groove 34 are possible using conventional techiques known to those in the art. For example, polysilicon could be used to backfill the grooves 30, 32 and 34 instead of applying the second oxide layer 36. Before depositing the polysilicon, a short thermal oxidation may be done to form an oxide layer 42 on the inside surface of second type groove 34, as shown in FIG. 1k, to isolate the polysilicon filler material 40 from the epitaxial layer 16. This method would reduce thermal stress and would allow the first oxide layer 12 to be used as a stop layer for the subsequent etch to clear the bottom of the second type groove 34. Using polysilicon to backfill the grooves 30, 32 and 34 would provide a strong end point detection method for the subsequent filling of the second type groove 34 after it is etched to penetrate the substrate 14. Additional methods of filling the second type groove 34 are also possible using combinations of polysilicon and oxide to alleviate thermal stress and enhance planarity.

In accordance with the preferred embodiment of the present invention, and, as illustrated in FIG. 1j, the structure of a semiconductor device having improved device isolation is as follows: the semiconductor wafer 10 includes the epitaxial layer 16 formed over the substrate 14. The epitaxial layer 16 includes the N-well region 18 adjacent to the P-well region 20. The first groove 30 is formed in the N-well region 18 and the second groove 32 is formed in the P-well region 20. The first groove 30 and the second groove 32 are each shallower in depth than the well regions 18 and 20 in which they respectively reside. The third groove 34 is formed between the N-well region 18 and tje P-well region 20. The third groove 34 is deeper than both the first and second grooves 30 and 32, extending to such a depth that it penetrates the substrate 14. Implanted in the first groove 30 is the P-type impurity 41 and implanted in the second groove 32 is the N-type impurity 43. The first groove 30 and the second groove 32 are both substantially filled with the filler material 38 of oxide. The third groove is also filled with the filler material 40 of oxide.

The first groove 30 operates to isolate devices within the N-well region 18. The second groove 32 operates to isolate devices within the P-well region 20. The oxide material 38 and the implanted impurities 41 and 43 operate to improve the isolating characteristics of the first and second grooves 30 and 32, respectively. The oxide material 40 filling the third groove 34 improves the ability of the third groove 34 to prevent latch-up between devices in the adjacent well regions 18 and 20.

A second embodiment of the present invention is illustrated in FIG. 1k, in which the filler material 40 is comprised of polysilicon. The second embodiment of the present invention additionally includes the layer of thermal oxide 42 which serves to isolate the polysilicon filler material 40 from the epitaxial layer 16. The use of the polysilicon filler material 40 serves to reduce thermal stress and also provide the process advantages described above.

The foregoing description of a specific embodiment of the present invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto and their equivalents.

What is claimed is:

1. An improved metal oxide semiconductor (MOS) device, said MOS device having a substrate and having a first conductivity type region and a second conductivity type region formed in an epitaxial layer over said substrate, said MOS device further having two devices of a second conductivity type within the region of a first conductivity type, the improvement comprising:
    a first groove formed between said two devices of said second conductivity type in said first conductivity type region, said first groove being shallower in depth than said first conductivity type region, said first groove operating to isolate from one another said two devices of a second conductivity type; and
    a second groove formed between said first conductivity type region and said second conductivity type region, said second groove extending to a depth greater than the depth of said first groove, and said second groove extending to such a depth that said second groove penetrates said substrate, said second groove operating to isolate said first conductivity type region from said second conductivity type region,
    wherein said first groove and said second groove are substantially filled with filler material.

2. A metal oxide semiconductor device in accordance with claim 1, wherein said filler material in said first groove comprises silicon dioxide and said filler material in said second groove comprises polysilicon.

3. A semiconductor device in accordance with claim 1 wherein said semiconductor device further includes an impurity implanted in said first groove, said impurity being of a conductivity type opposite to said first conductivity type of said first region.

4. A semiconductor device in accordance with claim 2 further including a layer of thermal oxide on the inside surface of said second groove.

5. An improved complementary metal oxide semiconductor (CMOS) device, said CMOS device having a substrate and having a first conductivity type region and a second conductivity type region formed in an epitaxial layer over said substrate, said MOS device further having two devices of a second conductivity type within the region of a first conductivity type, and two devices of a first conductivity type within the region of a second conductivity type, the improvement comprising:
    a first groove formed between said two devices of a second conductivity type in said first conductivity type region, said first groove being shallower in depth than said first conductivity type region, said first groove operating to isolate from one another said two devices of a second conductivity type;
    a second groove formed between said two devices of a first conductivity type in said second conductivity type region, said second groove being shallower in depth than said second conductivity type region, said second groove operating to isolate from one another said two devices of a first conductivity type; and
    a third groove formed between said first conductivity type region and said second conductivity type region, said third groove extending to a depth greater than the depth of said first and second grooves, and said second groove extending to such a depth that said third groove penetrates said substrate, said third groove operating to isolate said first conductivity type region from said second conductivity type region,
    wherein said first, second and third grooves are substantially filled with filler material.

6. A CMOS device in accordance with claim 2, wherein said filler material in said first and second grooves comprises silicon dioxide and said filler material in said third groove comprises polysilicon.

7. A semiconductor device in accordance with claim 5 wherein said semiconductor device further includes a first type impurity implanted in said first groove, and a second type impurity implanted in said second groove, said first type impurity being of a conductivity type opposite to said first conductivity type of said first region, and said second impurity type being of a conductivity type opposite to said second conductivity type of said second region.

8. A semiconductor device in accordance with claim 6 further including a layer of thermal oxide on the inside surface of said third groove.

* * * * *